(12) United States Patent
Henson

(10) Patent No.: US 8,673,757 B2
(45) Date of Patent: Mar. 18, 2014

(54) STRUCTURE AND METHOD FOR USING HIGH-K MATERIAL AS AN ETCH STOP LAYER IN DUAL STRESS LAYER PROCESS

(75) Inventor: William K. Henson, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 483 days.

(21) Appl. No.: 12/913,795

(22) Filed: Oct. 28, 2010

(65) Prior Publication Data

US 2012/0104505 A1 May 3, 2012

(51) Int. Cl.
*H01L 21/02* (2006.01)

(52) U.S. Cl.
USPC ........... 438/585; 438/586; 438/703; 438/761; 438/778; 257/E21.158; 257/E21.635; 257/E27.062; 257/E29.242

(58) Field of Classification Search
USPC .................. 438/585, 586, 703, 761, 778; 257/E21.158, 635, 27.062, 29.242
See application file for complete search history.

(56) References Cited

U.S. PATENT DOCUMENTS

| | | | |
|---|---|---|---|
| 8,198,166 B2 * | 6/2012 | Kammler et al. | 438/303 |
| 8,247,850 B2 * | 8/2012 | Jawarani et al. | 257/288 |
| 2008/0251853 A1 | 10/2008 | Chen et al. | |
| 2009/0020823 A1 * | 1/2009 | Fujita | 257/369 |
| 2009/0057809 A1 * | 3/2009 | Richter et al. | 257/499 |
| 2009/0166814 A1 * | 7/2009 | Hohage et al. | 257/640 |
| 2010/0090321 A1 * | 4/2010 | Mulfinger et al. | 257/632 |
| 2010/0133620 A1 * | 6/2010 | Richter | 257/368 |
| 2010/0187636 A1 * | 7/2010 | Yang et al. | 257/369 |
| 2010/0285668 A1 * | 11/2010 | Richter et al. | 438/703 |
| 2010/0330790 A1 * | 12/2010 | Hempel et al. | 438/585 |
| 2011/0081774 A1 * | 4/2011 | Yeh et al. | 438/591 |
| 2011/0175148 A1 * | 7/2011 | Yan et al. | 257/288 |
| 2012/0104505 A1 * | 5/2012 | Henson | 257/369 |
| 2012/0161242 A1 * | 6/2012 | Richter et al. | 257/369 |
| 2012/0219960 A1 * | 8/2012 | Bayley et al. | 435/6.19 |

* cited by examiner

*Primary Examiner* — Michael Lebentritt
(74) *Attorney, Agent, or Firm* — Scully, Scott, Murphy & Presser, P.C.; H. Daniel Schnurmann

(57) ABSTRACT

A method is provided that includes forming a high-k dielectric etch stop layer over at least a first conductivity type semiconductor device on a first portion of a substrate and at least a second conductivity type semiconductor device on a second portion of the semiconductor device. A first stress-inducing layer is deposited over the first conductivity type semiconductor device and the second conductivity type semiconductor device. The portion of the first stress-inducing layer that is formed over the second conductivity type semiconductor device is then removed with an etch that is selective to the high-k dielectric etch stop layer to provide an exposed surface of second portion of the substrates that includes at least the second conductivity type semiconductor device. A second stress-inducing layer is then formed over the second conductivity type semiconductor device.

18 Claims, 6 Drawing Sheets

STRUCTURE AND METHOD FOR USING HIGH-K MATERIAL AS AN ETCH STOP LAYER IN DUAL STRESS LAYER PROCESS

BACKGROUND

The present disclosure relates to a semiconductor structure and a method of fabricating such a structure, in which carrier mobility is enhanced by at least one stress-inducing layer.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

The present disclosure provides a semiconductor structure and a method of fabricating the same in which stress enhancement is achieved for both nFET and pFET devices. In one embodiment, the method includes forming a first conductivity type semiconductor device on a first portion of a substrate, and forming a second conductivity type semiconductor device on a second portion of the substrate. A high-k dielectric etch stop layer is then formed over at least the first conductivity type semiconductor device and the second conductivity type semiconductor device. A first stress-inducing layer is deposited over the first conductivity type semiconductor device and the second conductivity type semiconductor device. The portion of the first stress-inducing layer that is formed over the second conductivity type semiconductor device is then removed with an etch that is selective to the high-k dielectric etch stop layer to provide an exposed surface of second portion of the substrate that includes at least the second conductivity type semiconductor device. A second stress-inducing layer is then formed over the second conductivity type semiconductor device.

In another embodiment, the method includes forming a first conductivity type semiconductor device on a first portion of a substrate, and forming a second conductivity type semiconductor device on a second portion of the substrate. A first high-k dielectric etch stop layer is then formed over at least the first conductivity type semiconductor device and the second conductivity type semiconductor device. A first stress-inducing layer is deposited over the first portion and the second portion of the substrate. A portion of the first stress-inducing layer that is formed over the second portion of the substrate is then removed with an etch that is selective to the first high-k dielectric etch stop layer to expose at least the second conductivity type semiconductor device. A second high-k dielectric etch stop layer is then deposited over the remaining portion of the first stress-inducing layer. A second stress-inducing layer is then formed over the second conductivity type semiconductor device. The portion of the second stress-inducing layer that is overlying the remaining portion of the first stress-inducing layer is then removed with an etch that is selective to the second high-k dielectric etch stop layer.

In another aspect, a semiconductor device is provided that includes a first conductivity type semiconductor device in a first portion of a substrate and a second conductivity type semiconductor device is a second portion of the substrate. At least one high-k dielectric etch stop layer is present over the first conductivity type semiconductor device and the second conductivity type semiconductor device. A first stress-inducing layer is located on a portion of the at least one high-k dielectric etch stop layer that is present over the first conductivity type semiconductor device. A second stress-inducing layer is present on a portion of the at least one high-k dielectric etch stop layer that is present over the second conductivity type semiconductor device.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
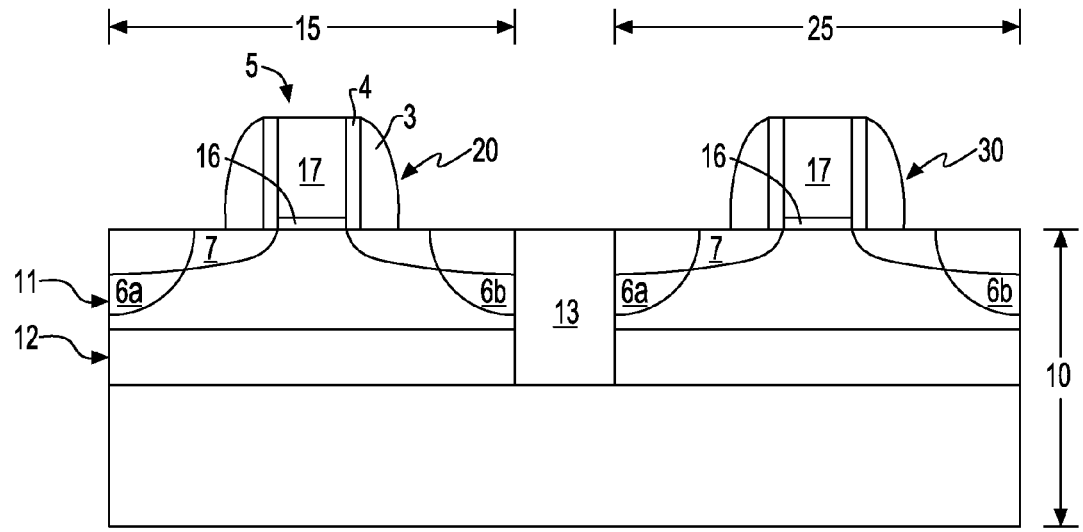
FIG. 1 is a side cross-sectional view depicting a substrate including at least a first conductivity type semiconductor device in a first portion of the substrate and a second conductivity type semiconductor device in a second portion of the substrate, as used in accordance with at least one embodiment of the methods and structures of the present disclosure.

Detailed embodiments of the present disclosure are described herein; however, it is to be understood that the disclosed embodiments are merely illustrative of the present disclosure that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure relates to a method for forming semiconductor devices having stress induced performance enhancements that employ at least one high-k dielectric materials as an etch stop layer. As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. The doping of the source and drain regions of the semiconductor device dictate the conductivity type of the semiconductor device. As used herein, the term "conductivity type" denotes a semiconductor device being p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to, antimony, arsenic and phosphorous.

In one embodiment, the semiconductor device that is provided by the present disclosure is a field effect transistor. A field effect transistor is a semiconductor device in which output current, i.e., source-drain current, is controlled by the voltage applied to a gate structure. A field effect transistor has three terminals, i.e., a gate structure, a source region and a drain region. The gate structure controls output current, i.e., flow of carriers in the channel, of a semiconducting device, such as a field effect transistor, through electrical or magnetic fields. The channel is the region between the source region and the drain region of a semiconductor device that becomes conductive when the semiconductor device is turned on. A p-type conductivity semiconductor device, such as a pFET, is a semiconductor device in which the source and drain regions of the device are doped with a p-type dopant. An n-type conductivity semiconductor device, such as an nFET, is a semiconductor device in which the source and drain regions of the device are doped with an n-type dopant.

In one embodiment, the stress induced performance enhancements are produced in the semiconductor devices by stress-inducing layers that are formed over the semiconductor device. The term "stress-inducing layer" denotes a material having an intrinsic stress, in which the intrinsic stress effectuates a stress in an underlying material. In some embodiments, the stress-inducing layer is formed on a gate structure of the semiconductor device, and is therefore overlying the channel of the semiconductor device. In such an embodiment the stress-inducing layer induces a stress in the channel of the semiconductor device. A compressive stress-inducing layer increases carrier mobility in the channel of p-type semiconductor devices, but typically decreases carrier mobility in the channel of n-type semiconductor devices. The term "compressive stress-inducing layer" denotes a material having an intrinsic compressive stress, in which the intrinsic compressive stress produces a compressive stress in an underlying material. A tensile stain-inducing layer increases carrier mobility in the channel of n-type semiconductor devices, but decreases the carrier mobility in the channel of p-type semiconductor devices. The term "tensile stress-inducing material" denotes a material layer having an intrinsic tensile stress, in which the intrinsic tensile stress produces a tensile stress in an underlying material.

Complementary metal oxide semiconductor (CMOS) devices including both p-type semiconductor devices and n-type semiconductor devices. To provide for optimized performance in both n-type semiconductor devices and p-type semiconductor devices, a method is provided in which a tensile stress-inducing layer is present over only the n-type semiconductor devices and a compressive stress-inducing layer is present over only the p-type semiconductor devices. To provide a structure in which a compressive stress-inducing layer is present over only the p-type semiconductor devices and a tensile stress-inducing layer is present over only the n-type semiconductor devices selective etching may be employed with etch stop materials. As used herein, the term "selective" in reference to a material removal process denotes that the rate of material removal for a first material is greater than the rate of removal for at least another material of the structure to which the material removal process is being applied. Etch selectivities can range from 10:1 to as high as 1000:1 with values of on the order of 100:1 being more typical. An "etch stop" material is the material that the selective etch is selective to.

In one embodiment, the etch stop material that is utilized in the methods and structures of the present disclosure is a high-k dielectric etch stop layer. A "high-k" dielectric is a dielectric material having a dielectric constant greater than silicon oxide ($SiO_2$) at room temperature, e.g., 20° C. to 25° C. In one example the high-k dielectric etch stop layer has a dielectric constant of 4.0 or greater. In comparison to etch stop layers composed of silicon oxide ($SiO_2$), by employing a high-k dielectric etch stop layer to protect the semiconductor devices while removing the stress-inducing layer, the thickness of the etch stop layer may be reduced. Typical etch rate selectivities of the stress inducing film to silicon dioxide range from 10:1 to 50:1. High-k gate dielectrics have a much higher etch rate selectivity with respect to removing the stress inducing film, wherein the etch selectivity may range from 100:1 to 1000:1. Because of the higher etch rage selectivity of the higher-k dielectrics, a thinner etch stop layer can be used. The reduced thickness that is provided by high-k dielectric etch stop layer allows for increasing the thickness of the stress-inducing layer that is formed over the semiconductor device. This is especially the case when there is more than one pitch separating the semiconductor devices. The stress inducing material will typically be thicker on structures where the gates are separated by a single pitch. Some technologies make use of circuits where a sub-set of selected circuits space the gates by 2× the technology pitch. In the 1× pitch structures the stress inducing material tends to merge between the gates leading to a higher thickness compared to structures where the gates are spaced by 2×. During the etch process of the stress inducing material, the areas that have gates spaced at 2× pitch will have the stress inducing material removed before all the stress inducing material is removed from the 1× pitch areas. The total etch time will be dictated by the time needed to remove the nitride on structures with gates spaced at 1× pitch. As a result, the subset of areas with gates spaced at 2× pitch will be exposed to a longer over-etch and is therefore in some examples advantageous to have a robust etch stop layer to minimize damage to these areas. The term "pitch" means the center-to-center distance between two repeating elements of a circuit including semiconductor devices. In yet another aspect of the disclosure, the high-k dielectric etch stop layer absorbs oxygen. By absorbing oxygen, the high-k dielectric etch stop layer reduces threshold voltage shifts that typically result from oxygen being introduced to the semiconductor device during middle of the line (MOL) and back end of the line (BEOL) processing. Oxygen induces a positive charged vacancy that leads to threshold voltage shifts of a CMOS device using a high-k gate dielectric. Furthermore, the temperature range at which positive charged vacancies are created may range from 350° C. to 600° C. MOL and BEOL processes range from 300° C. to 500° C. The high-k etch stop layer absorbs the oxygen before reaching the gate dielectric resulting in more stable device characteristics (threshold voltage) as a function of MOL and BEOL processes. The methods and structures disclosed herein are now described in more detail with reference to FIGS. 1-12.

FIG. 1 depicts one embodiment of a substrate 10 including at least a first conductivity type semiconductor device 20 in a first portion 15 of the substrate 10 and a second conductivity type semiconductor device 30 in a second portion 25 of the substrate 10. In the embodiment that is depicted in FIG. 1, the first conductivity type semiconductor device 20 is an n-type semiconductor device, such as an nFET, and the second conductivity type semiconductor device 30 is a p-type semiconductor device, such as a pFET. It is noted that the conductivity of the semiconductor devices that are present in the first portion 15 and the second portion 25 of the substrate 10 may be reversed.

The substrate 10 may be any silicon-containing substrate including, but not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment, when the substrate 10 is a silicon-on-insulator (SOI) or SiGe-on-insulator (SGOI) substrate, as depicted in FIG. 1, the thickness of the semiconducting Si-containing layer 11 that is atop the buried insulating layer 12 can have a thickness on the order of 10 nm or greater. In one embodiment, the SOI or SGOI substrate may be fabricated using a thermal bonding process, or alternatively be fabricated by an ion implantation process, such as separation by ion implantation of oxygen (SIMOX). The semiconductor substrate 10 may also include a first doped (n- or p-) region, and a second doped (n- or p-) region. For clarity, the doped regions are not specifically labeled in the drawings of the present application. These doped regions are known as "wells".

In one embodiment, the substrate 10 includes an isolation region 13 separating the semiconducting silicon-containing layer 11 within the first portion 15 of the substrate 10 from the semiconducting silicon-containing layer 11 that is present within the second portion 20 of the substrate 10. In one embodiment, the isolation region 13 is formed by forming a trench in the substrate 10 utilizing a dry etching process, such as reactive-ion etching (RIE) or plasma etching, and then filling the trench with an insulating material, such as an oxide. In one embodiment, the trench may be filled using a deposition method, such as chemical vapor deposition (CVD).

In one embodiment, each n-type semiconductor device 20 and each p-type semiconductor device 30 includes a gate structure 5, wherein the gates structures 5 are formed atop the substrate 10 utilizing deposition, lithography, and etching. In one embodiment, a gate stack is first provided atop the substrate 10 by depositing a gate dielectric layer and then a gate conductor layer using forming methods, such as chemical vapor deposition and/or thermal growth. Thereafter, the gate stack is patterned and etched to provide the gate structure 5, wherein each gate structure 5 includes a gate dielectric 16 and a gate conductor 17.

In one embodiment, the gate dielectric 16 is an oxide material and is greater than 0.8 nm thick. In another embodiment, the gate dielectric 16 may have a thickness ranging from 1.0 nm to 6.0 nm. In one embodiment, the gate dielectric 16 is a high-k gate dielectric comprised of an insulating material having a dielectric constant of greater than 4.0 at room temperature, i.e., 20° C. to 25° C. More specifically, the high-k gate dielectric employed in the present disclosure may include, but not limited to, an oxide, nitride, oxynitride and/or silicate including metal silicates and nitrided metal silicates. In one embodiment, the gate dielectric 16 is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. The gate dielectric 16 may also be composed of hafnium silicate or hafnium silicon oxynitride.

The gate conductor 17 may be comprised of polysilicon and/or a metal. The gate conductor 17 is formed atop the gate dielectric 16 utilizing a deposition process, such as CVD and/or sputtering. In one embodiment, the gate conductor 17 comprises doped polysilicon. The polysilicon dopant can be elements from group III-A or a group V-A of the Periodic Table of Elements. The dopant may be introduced during deposition of the gate conductor layer or following subsequent patterning and etching of the gate conductor 17.

In one embodiment, the material layers that provide the gate dielectric 16 and the gate conductor 17 are blanket deposited on the substrate 10 to provide a material stack. The material stack may be patterned and etched to provide the gate structures 5. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected and become the gate structures 5, while the exposed regions are removed using a selective etching process. In another embodiment, the material layers that provide the gate dielectric 16 and the gate conductor 17 include a high-k layer with a thin metal (2 nm-10 nm) followed by blanket polysilicon.

The distance separating adjacent gate structures 5 is referred to as the pitch. In one embodiment, the pitch may be measured from the center of the upper surface of the gate conductor 17 of the first conductivity type semiconductor device 20, e.g., an n-type conductivity device, to the center of the upper surface of the gate conductor 17 of an adjacent semiconductor device, e.g., p-type conductivity device 30. The actual dimensions for the pitch may depend upon the technology node. In one example, the pitch is less than 500 nm. In another example, the pitch ranges from 20 nm to 450 nm. In yet another example, the pitch ranges from 40 nm to 300 nm.

In one embodiment, following the formation of the gate structure 5, a thin dielectric spacer 4 is formed abutting and protecting the sidewalls of each gate structure. In one embodiment, the thin dielectric spacer 4 is an oxide or nitride, such as $SiO_2$ or $Si_1N_4$. The thin dielectric spacer 4 typically has a width W1 that ranges from 1 nm to 20 nm. Forming processes such as deposition or thermal growing may produce the thin dielectric spacer 4. In a following process step, source and drain extension regions 7 may be formed in the substrate 10 and partially extend under each gate structure 5. Source and drain extension regions 7 are formed via ion implantation. The p-type conductivity semiconductor devices 30 are produced within Si-containing substrates by doping the source and drain extension regions 7 with elements from group III-A of the Periodic Table of Elements. The n-type conductivity semiconductor devices 20 are produced within Si-containing substrates by doping the source/drain extension regions 7 with elements from group V-A of the Periodic Table of Elements.

Following source and drain extension region 7 implants, a disposable spacer 3 is formed abutting the exterior surface of the thin dielectric spacer 4. The disposable spacer 3 is comprised of a dielectric, such as an oxide, nitride, oxynitride and/or any combination thereof. In one embodiment, the thin dielectric spacers 4 are composed of an oxide, such as $SiO_2$, and the disposable spacer 3 is composed of a nitride, such as $Si_3N_4$. The disposable spacer 3 may be formed by deposition and etching. The width of the disposable spacer 3 should be sufficiently wide such that the source and drain silicide contacts (to be subsequently formed) do not encroach underneath the edges of each of the gate stacks. Also, the widths of the disposable spacer 3 should be sufficiently wide enough so that the deep source/drain implants also do not encroach significantly into the channel region of the semiconductor device to cause short channel effects. Typically, the source and drain silicide does not encroach underneath the edges of the gate structure 5 when the disposable spacer 3 has a width, as measured at the bottom, of 10 nm or greater.

Following disposable spacer 3 formation, a higher energy ion implant is conducted to form deep source regions 6a and deep drain regions 6b. These implants are conducted at a higher energy and higher concentration of dopant than the source and drain extension region 7 implant. The deep source region 6a and the deep drain region 6b are typically doped with a conductivity type consistent with the source and drain extension regions 7.

Metal semiconductor alloy contacts (not shown) may be formed on an upper surface of the deep source region 6a, deep drain region 6b, and the source and drain extension regions 7. In one embodiment, the metal semiconductor alloy contacts are composed of a silicide. Silicide formation includes forming a metal capable of reacting with silicon (Si) atop the entire structure, heating the structure to form a silicide, removing non-reacted metal and the oxygen barrier layer and, if needed, conducting a second heating step.

Figure 2:
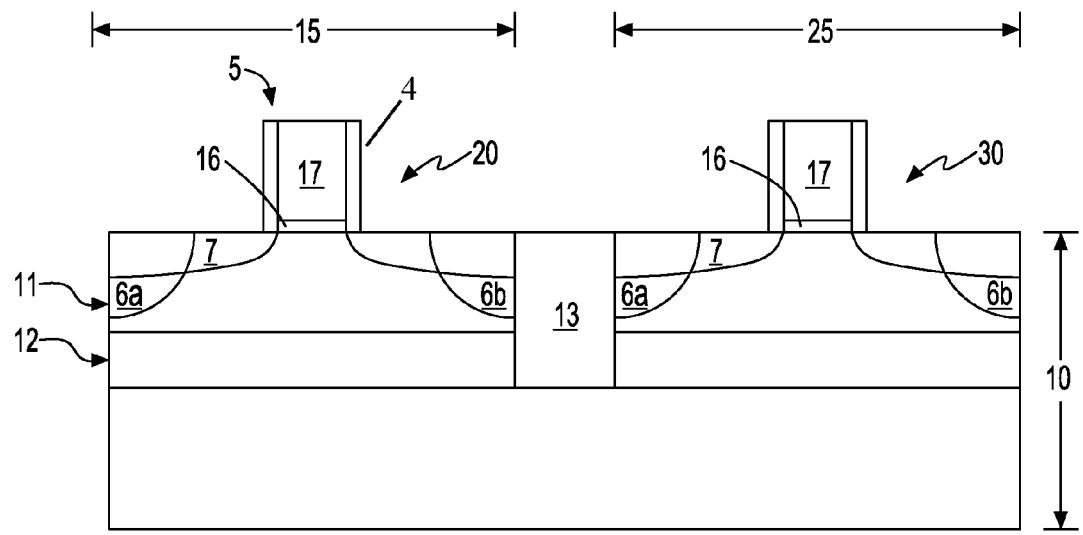
FIG. 2 is a side cross-sectional view depicting removing the spacers of the first and second conductivity type semiconductor devices, in accordance with one embodiment of the present disclosure.

In one embodiment, following deep source region 6a and deep drain region 6b formation and the formation of the metal semiconductor alloy contacts, the disposable spacers 3 are removed, as depicted in FIG. 2. Removing the disposable spacers 3 positions the subsequently formed stress-inducing layer in closer proximity to the channel of the semiconductor device in comparison to similar structures in which the disposable spacer 3 is not removed. In one embodiment, the disposable spacer 3 is removed by a selective etch process. A timed etching process may also be used to remove the disposable spacer 3. In one example, when the disposable spacer 3 is comprised of a nitride, such as $Si_3N_4$, and the thin dielectric spacers 4 are composed of an oxide, such as $SiO_2$, the etch chemistry for removing the disposable spacer 3 selective to the thin dielectric spacer 4 may be composed of at least one of $CH_2F_2$, $CHF_3$, $CH_3F$, and $O_2$.

The source region 6a, drain regions 6b, source and drain extension regions 7, and the gate structure 5, are activated by activation annealing. Activation anneal may be conducted at a temperature ranging from 850° C. to 1350° C.

Figure 3:
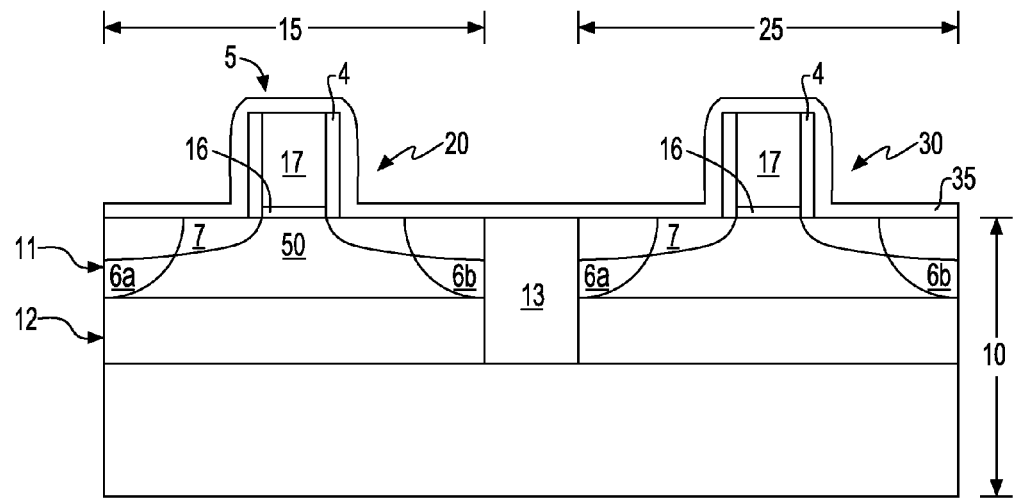
FIG. 3 is a side cross-sectional view depicting forming a high-k dielectric etch stop layer, i.e., a first high-k dielectric etch stop layer, over the first conductivity type semiconductor device in the first portion of the substrate and the second conductivity type semiconductor device in the second portion of the substrate, in accordance with one embodiment of the present disclosure.

FIG. 3 depicts one embodiment of forming a high-k dielectric etch stop layer 35, i.e., first high-k dielectric etch stop layer, over the first conductivity type semiconductor device 20 in the first portion 15 of the substrate 10 and the second conductivity type semiconductor device 30 in the second portion 25 of the substrate 10. The high-k dielectric etch stop layer 35 may be deposited on the sidewalls of the gate structures 5, an upper surface of the gate structures 5, and a portion of an upper surface of the substrate 10 separating the adjacent gate structures 5. In one example, in which the thin dielectric spacers 4 are present on the sidewalls of the gate structures 5, the high-k dielectric etch stop layer 35 is in direct contact with the thin dielectric spacers 4.

The high-k dielectric etch stop layer 35 may be composed of an oxide, a hafnium oxide, a nitrided hafnium oxide, a hafnium silicate or combinations and multi-layers thereof. In one embodiment, the high-k dielectric etch stop layer 35 is comprised of a material having a dielectric constant that is greater than 4.0, e.g., 4.1. In another embodiment, the high-k dielectric etch stop layer 35 is comprised of a material having a dielectric constant greater than 7.0. In yet another embodiment, the high-k dielectric etch stop layer 35 is comprised of a material having a dielectric constant ranging from greater than 4.0 to 50. The dielectric constants mentioned herein are relative to a vacuum at room temperature, i.e., 20° C. to 25° C.

Some examples of high-k dielectric materials suitable for the high-k dielectric etch stop layer 35 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the high-k dielectric etch stop layer 35 is hafnium oxide ($HfO_2$).

In one embodiment, the high-k dielectric etch stop layer 35 is a conformal layer that is formed using a conformal deposition process. The term "conformal" denotes a layer having a thickness that does not deviate from greater than or less than 30% of an average value for the thickness of the layer. In one embodiment, the high-k dielectric etch stop layer 35 is formed using a deposition process, such as chemical vapor deposition (CVD). Chemical vapor deposition (CVD) is a deposition process in which a deposited species is formed as a results of chemical reaction between gaseous reactants at an elevated temperature (typically being greater than 200° C.), wherein solid product of the reaction is deposited on the surface on which a film, coating, or layer of the solid product is to be formed. Variations of chemical vapor deposition (CVD) processes for depositing the high-k dielectric etch stop layer 35 include, but are not limited to, Atomic Layer CVD (ALCVD), Atmospheric Pressure CVD (APCVD), Low Pressure CVD (LPCVD) and Plasma Enhanced CVD (PECVD), Metal-Organic CVD (MOCVD) and others. One example of a conformal deposition process is plasma enhanced chemical vapor deposition (PECVD). In another embodiment, the high-k dielectric etch stop layer 35 may be formed by a thermal growth process such as, for example, oxidation, nitridation or oxynitridation.

By employing a high-k material for the etch stop layer instead of silicon oxide, $SiO_2$, the thickness of the etch stop layer may be reduced. A typical etch stop layer that is composed of silicon oxide, $SiO_2$, has a thickness that is greater than 25 Å. In one example, an etch stop layer that is composed of silicon oxide, $SiO_2$, has a thickness that ranges from 30 Å to 50 Å. In comparison, a high-k dielectric etch stop layer 35 has a thickness that is less than 20 Å. In one embodiment, the high-k dielectric etch stop layer 35 has a thickness that ranges from 15 Å to 20 Å. By reducing the thickness of the etch stop layer that is present over the first conductivity type semiconductor device 20 and the second conductivity type semiconductor device 30, the amount of tensile stress-inducing material that is formed over the first and second conductivity type semiconductor devices 20, 30 may be increased. The greater the thickness of the stress-inducing material that is present over the gate structures 5 to the first and second conductivity type semiconductor devices 20, 30, the greater the stress that is induced in the channel portion of the first and second type conductivity semiconductor devices 20, 30.

Figure 4:
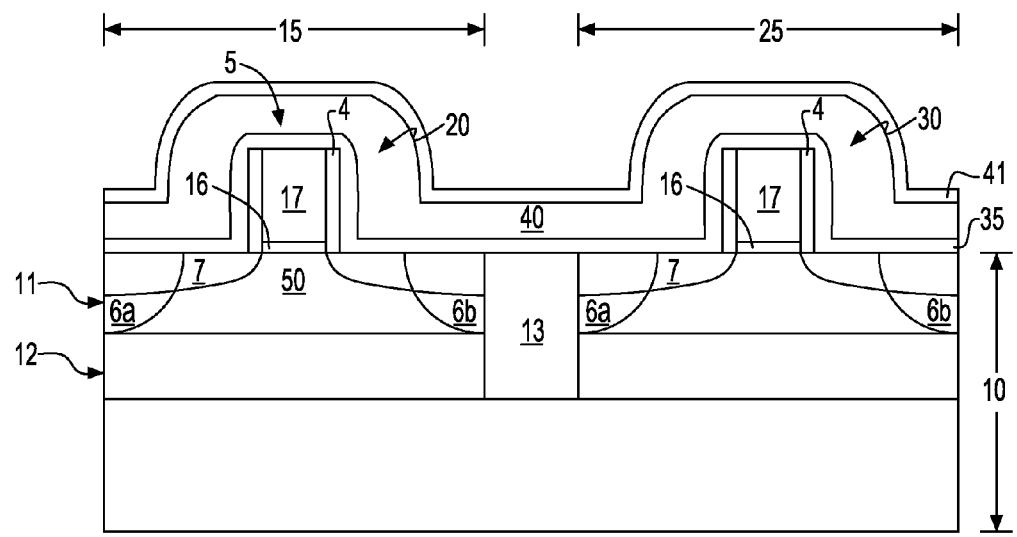
FIG. 4 is a side cross-sectional view depicting forming a first stress-inducing layer over the first conductivity type semiconductor device in the first portion of the substrate and the second conductivity type semiconductor device in the second portion of the substrate, in accordance with one embodiment of the present disclosure.

FIG. 4 depicts forming a first stress-inducing layer 40 over the first conductivity type semiconductor device 20 in the first portion 15 of the substrate 10 and the second conductivity type semiconductor device 30 in the second portion 25 of the substrate 10. The first stress-inducing layer 40 may be of a compressive stress or of a tensile stress. For the embodiment illustrated in FIG. 4, the first stress-inducing layer 40 is of a tensile stress. The first stress-inducing layer 40 may be any material that is capable of introducing a stress into the device channel. For example, the stress on the channel of the first conductivity type semiconductor device 20 that is induced by the first stress-inducing layer 40 is a tensile stress that has a magnitude ranging from 100 MPa to 1700 MPa. In another example, the tensile stress on the channel of the first conductivity type semiconductor device 20 has a magnitude ranging from 300 MPa to 600 MPa.

Examples of stress-inducing materials suitable for the first stress-inducing layer 40 include, but are not limited to, $Si_3N_4$, SiC, silicon oxynitride, boron nitride and other like materials. The first stress-inducing layer 40 can be formed utilizing various chemical vapor deposition (CVD) processes including, for example, low pressure CVD, plasma enhanced CVD, rapid thermal CVD, BTBAS-based ($C_8H_{22}N_2Si$ reacted with ammonia) CVD, where BTBAS is a metalorganic precursor for CVD applications. The stress type, i.e., tensile or compressive stress, may be controlled by modifying the precursor and deposition conditions.

The stress state of nitride-containing stress-inducing layers deposited by PECVD can be controlled by changing the deposition conditions to alter the reaction rate within the deposition chamber. In one embodiment, the first stress-inducing layer 40 is comprised of a nitride, e.g., silicon nitride, in which the first stress-inducing layer 40 induces a tensile stress on at least the channel of the first conductivity type, i.e., n-type, semiconductor device 20. The stress state of a first stress-inducing layer 40 that is composed of silicon nitride may be set by changing the deposition conditions such as: $SiH_4/N_2/He$ gas flow rate, pressure, RF power, and electrode gap. Rapid thermal chemical vapor deposition (RTCVD) can provide a nitride-containing first stress-inducing layer 40 having an internal tensile stress. The magnitude of the internal tensile stress produced within the nitride-containing first stress-inducing layer 40 deposited by RTCVD can be controlled by changing the deposition conditions. More specifically, the magnitude of the tensile stress within first stress-inducing layer 40 comprised of silicon nitride may be set by changing deposition conditions such as, precursor composition, precursor flow rate and temperature.

The first stress-inducing layer 40 is typically blanket deposited atop the high-k dielectric etch stop layer 35, and is typically deposited over at least the first conductivity type semiconductor device 20 and the second conductivity type semiconductor device 30. The first stress-inducing layer 40 is typically a conformal layer. In one embodiment, the first stress-inducing layer 40 has a thickness ranging from 20 nm to 150 nm. In another embodiment, the first stress-inducing layer 40 has a thickness ranging from 50 nm to 100 nm. In yet a further embodiment, the first stress-inducing layer 40 has a thickness ranging from 60 nm to 80 nm.

FIG. 4 further depicts forming a low-k dielectric etch stop layer 41, e.g., $SiO_2$, on the first stress-inducing layer 40. The low-k dielectric etch stop layer 41 is typically blanket deposited on the first stress-inducing layer 40 in both the first portion 15 and the second portion 25 of the substrate 10. The term "low-k" refers to a dielectric material having a dielectric constant that is less than 4.0 at room temperature, i.e., 20° C. to 25° C. In one embodiment, the low-k dielectric etch stop layer 41 has a dielectric constant ranging from 1.75 to 3.5. In another embodiment, the low-k dielectric etch stop layer 41 has a dielectric constant ranging from 2.0 to 3.2. In yet an even further embodiment, the low-k dielectric etch stop layer 41 has a dielectric constant ranging from 2.25 to 3.0. Examples of materials suitable for the low-k dielectric etch stop layer 41 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. In one example, the low-k dielectric etch stop layer 41 may be composed of silicon oxide ($SiO_2$).

In one embodiment, the low-k dielectric etch stop layer 41 is a conformal dielectric layer that is deposited using plasma enhanced chemical vapor deposition (PECVD). The thickness of the low-k dielectric etch stop layer 41 is greater than 25 Å. In one embodiment, the thickness of the low-k dielectric etch stop layer 41 ranges from 25 Å to 70 Å. In another embodiment, the thickness of the low-k dielectric etch stop layer 41 ranges from 30 Å to 50 Å.

In some embodiment, the low-k dielectric etch stop layer 41 may be replaced with a high-k dielectric layer, such as an Hf-containing material, e.g., hafnium oxide ($HfO_2$). In some embodiments, the low-k dielectric etch stop layer 41 may be omitted.

Figure 5:
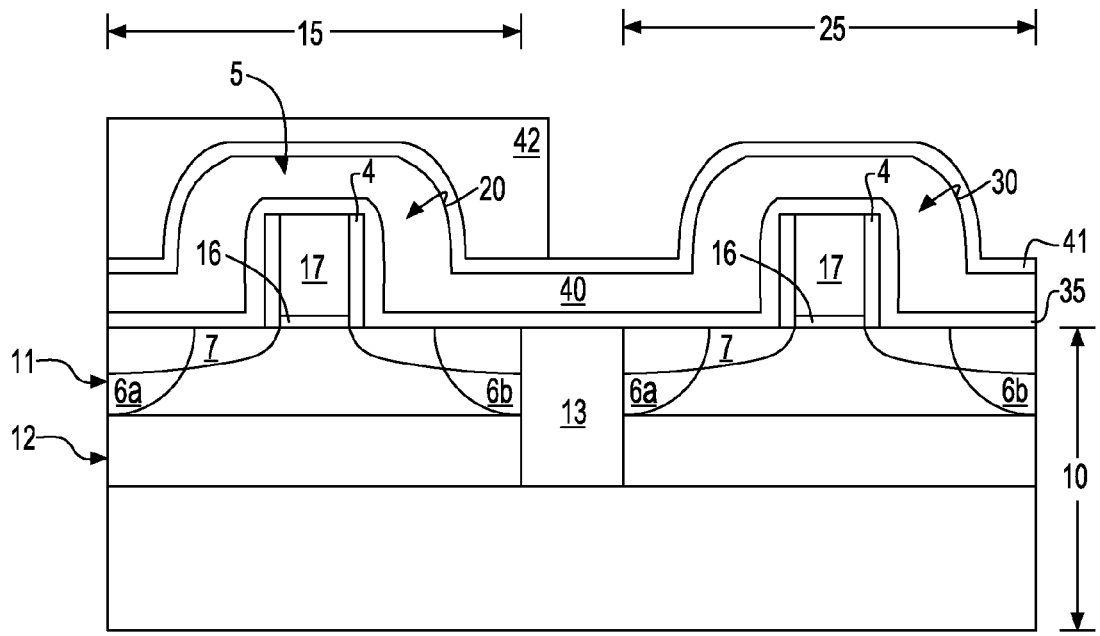
FIG. 5 is a side cross-sectional view depicting forming an etch mask, i.e., a first etch mask, over the first portion of the substrate including the first stress-inducing layer, in accordance with one embodiment of the present disclosure.
Figure 6:
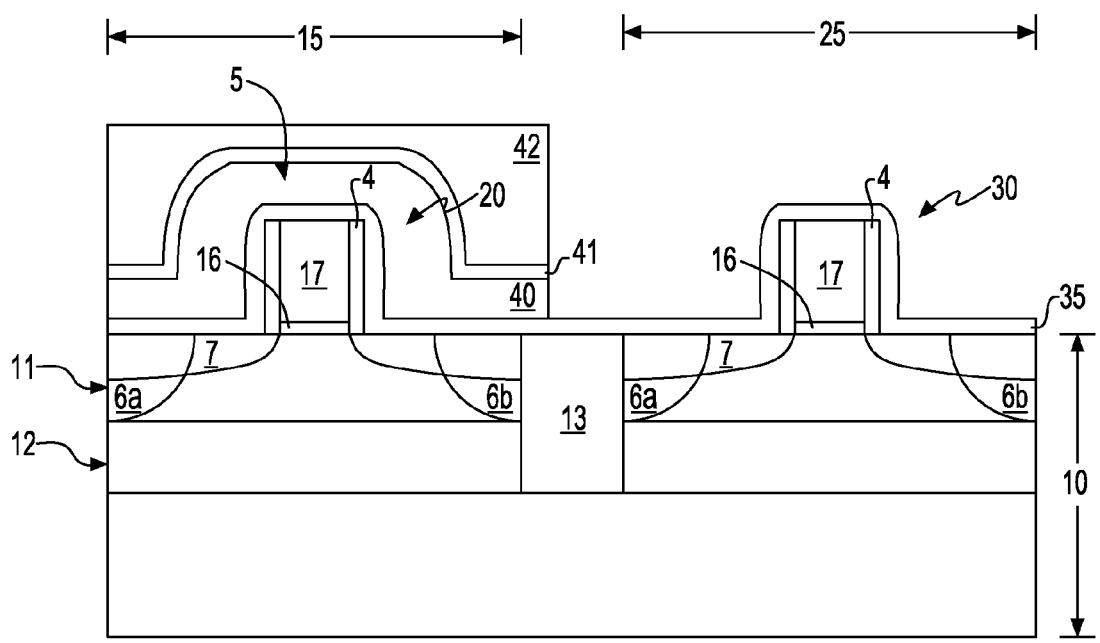
FIG. 6 is a side cross-sectional view depicting removing the portion of the first stress-inducing layer that is located over the second conductivity type semiconductor device with an etch that is selective to the high-k dielectric etch stop layer, in accordance with one embodiment of the present disclosure.

FIGS. 5 and 6 depict one embodiment of removing a portion of the first stress-inducing layer 40 that is over the second conductivity type semiconductor device 30 with an etch that is selective to the high-k dielectric etch stop layer 35 to provide an exposed surface of second portion 25 of the substrate 10 that includes at least the second conductivity type semiconductor device 30. In one embodiment, the exposed surface of the second portion 25 of the substrate 10 also includes a portion of the low-k dielectric etch stop layer 41. That is, the etch chemistry which removes the portion of the first stress-inducing layer 40 that is overlying the second conductivity semiconductor device 30 that is present in the second portion 25 of the substrate 10 also removes the exposed portion of the low-k dielectric etch stop layer 41. In another embodiment, the exposed portion of the low-k dielectric etch stop layer 41, and the portion of the first stress-inducing layer 40 that is underlying the exposed portion of the low-k dielectric etch stop layer 41, are removed with a two stage etch process. In the first stage of the etch process, the exposed portion of the low-k dielectric etch stop layer 41 is removed selectively to the underlying portion of the first stress-inducing layer 40 and the first etch mask 42. The first stage of the etch process exposes at least the portion of the first stress-inducing layer 40 that is present in the second portion 25 of the substrate 10. The second stage of the two stage etch process removes the exposed portion of the first stress-inducing layer 40 selective to the high-k dielectric etch stop layer 35 and the first etch mask 42.

FIG. 5 depicts one embodiment of forming an etch mask 42, i.e., a first etch mask, over the portion of the first stress-inducing layer 40 that is within the first portion 15 of the substrate 10 and is present overlying the first conductivity type semiconductor device 20. The first etch mask 42 may comprise soft and/or hardmask materials and can be formed using deposition, photolithography and etching. In one embodiment, the first etch mask 42 comprises a photoresist. A photoresist first etch mask can be produced by applying a photoresist layer to the surface of the substrate 10, exposing the photoresist layer to a pattern of radiation, and then developing the pattern into the photoresist layer utilizing a resist developer.

In another embodiment, the first etch mask 42 can be a hardmask material. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to, silsequioxanes, siloxanes, and boron phosphate silicate glass (BPSG). A first etch mask 42 comprising a hardmask material may be formed by blanket depositing a layer of hardmask material, providing a patterned photoresist atop the layer of hardmask material, and then etching the layer of hardmask material to provide a first etch mask 42.

FIG. 6 depicts one embodiment of removing the portion of the first stress-inducing layer 40 that is present over the second conductivity type semiconductor device 30 with an etch that is selective to the high-k dielectric etch stop layer 35. FIG. 6 further depicts removing the exposed portion of the low-k dielectric etch stop layer 41.

The etch process for removing the exposed portion of the first stress-inducing layer 40, and the exposed portion of the low-k dielectric etch stop layer 41 (when present), may be an anisotropic etch process or an isotropic etch process. An anisotropic etch process is a material removal process in which the etch rate in the direction normal to the surface to be etched is greater than in the direction parallel to the surface to be etched. Isotropic etch processes is a material removal process in which the etch rate is non-directional when compared to an anisotropic etch processes.

The anisotropic etch for removing the exposed portion of the first stress-inducing layer 40 may include reactive-ion etching (RIE). Reactive ion etching (RIE) is a form of plasma etching in which during etching the surface to be etched is placed on the RF powered electrode is exposed to reactive gases in the presence of an RF field. Moreover, during RIE the surface to be etched takes on a potential that accelerates the reactive etching species extracted from a plasma toward the surface, in which the chemical etching reaction is taking place in the direction normal to the surface. Other examples of anisotropic etching that can be used at this point of the disclosure include ion beam etching, plasma etching or laser ablation. Isotropic etching or removing the exposed portions of the first stress-inducing layer 40 may be achieved using a wet chemical etch.

In one embodiment, when the first stress-inducing layer 40 is composed of silicon nitride ($Si_3N_4$), the first high-k dielectric etch stop layer 35 is composed of hafnium oxide ($HfO_2$), and the first etch mask 42 is composed of a photoresist material, the etch chemistry for removing the exposed portion of the first stress-inducing layer 40 selective to the first high-k dielectric etch stop layer 35 and the first etch mask 42 may be composed of at least one of hydrofluoric acid (HF), buffered HF, and phosphoric acid ($H_3PO_4$) solutions. The etch chemistry that removes the first high-k dielectric etch stop layer 35 may also remove the exposed portion of the low-k dielectric etch stop layer 41.

Following removal of the exposed portions of the first stress-inducing layer 40 and the low-k dielectric etch stop layer 41, the first etch mask 42 may be removed. The first etch mask 42 may be removed using a selective etch process, a chemical strip or oxygen ashing. Once the first etch mask 42 has been removed, the uppermost surface that is present in the first portion 15 of the substrate 10 is the upper surface of the etch stop layer 41. The upper surface that is present in the second portion 25 of the substrate is the upper surface of the high-k dielectric etch stop layer 35.

Figure 7:
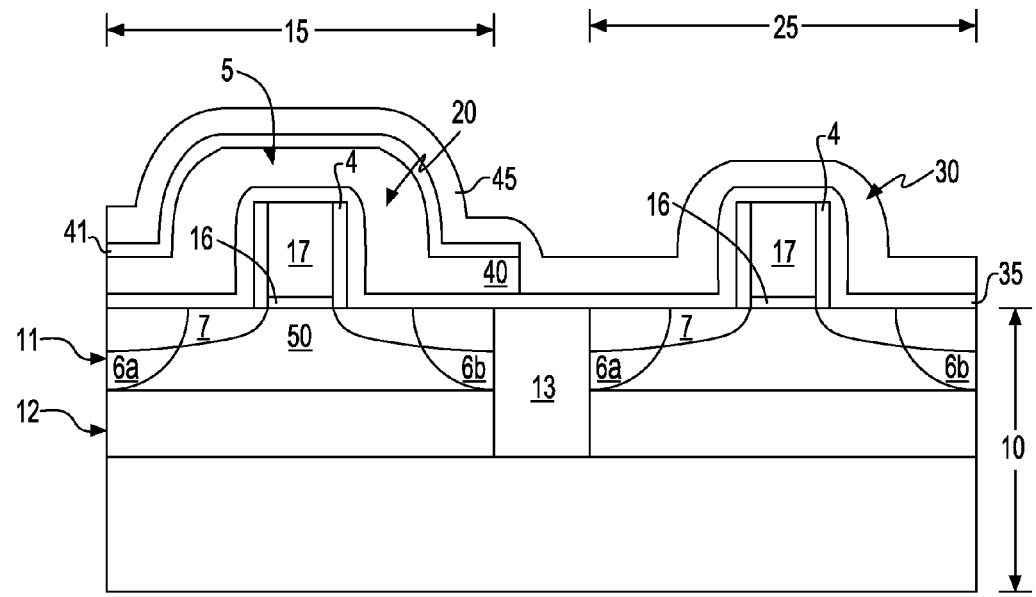
FIG. 7 is a side cross-sectional view depicting depositing the second stress-inducing layer over the first conductivity type semiconductor device that is in the first portion of the substrate, and depositing the second stress-inducing layer over the second conductivity type semiconductor device in the second portion of the substrate, in accordance with one embodiment of the present disclosure.
Figure 8:
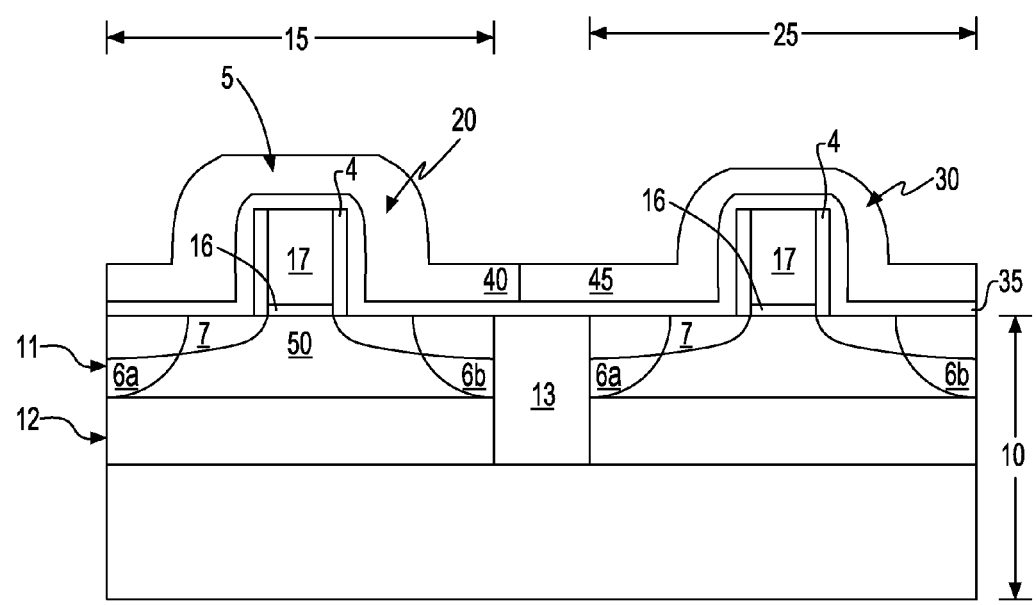
FIG. 8 depicts removing the etch mask and removing the portion of the second stress-inducing layer that is present over the first conductivity type semiconductor device, wherein a remaining portion of the second stress-inducing layer is present over the second conductivity type semiconductor device, in accordance with one embodiment of the present disclosure.

FIGS. 7 and 8 depict one embodiment of forming a second stress-inducing layer 45 over the second conductivity type semiconductor device 30 that is present in the second portion 25 of the substrate 10. In the embodiment that is depicted in FIG. 7, the second stress-inducing layer 45 is blanket deposited overlying the entire surface of the substrate 10 including the first conductivity type semiconductor device 20, i.e., n-type semiconductor device, that is present in the first portion 15 of the substrate 10, and the second conductivity type semiconductor device 30, i.e., p-type semiconductor device, that is present in the second portion 25 of the substrate 10. In one example, the second stress-inducing layer 45 is formed in direct contact with the remaining portion of the low-k dielectric etch stop layer 41 that is present in the first portion 15 of the substrate 10. The second stress-inducing layer 45 is also formed in direct contact with the exposed portion of the first high-k dielectric etch stop layer 35 that is present in the second portion 25 of the substrate 10.

FIG. 7 depicts one embodiment of depositing a second stress-inducing layer 45 over the remaining portion of the low-k dielectric etch stop layer 41 that is in the first portion 15 of the substrate 10, and depositing the second stress-inducing layer 45 over the second conductivity type semiconductor device 30 in the second portion 25 of the substrate 10. In one example, the second stress-inducing layer 45 is formed in direct contact with the high-k dielectric etch stop layer 35 that is present in the second portion 25 of the substrate 10.

The second stress-inducing layer 45 is of a stress type that is opposite the stress type of the first stress-inducing layer 40. In the embodiment that is depicted in FIGS. 7 and 8, in which the first stress-inducing layer 40 is composed of a tensile stress-inducing material, the second stress-inducing layer 45 is composed of a compressive stress-inducing material. It is noted that other embodiments can be employed, in which the first conductivity type semiconductor device 20 is an n-type semiconductor device, such as an nFET, the first stress-inducing layer 35 is a tensile stress-inducing layer, the second conductivity type semiconductor device 30 is a p-type semiconductor device, such as a pFET, and the second stress-inducing layer 45 is a compressive stress-inducing layer.

For the embodiment illustrated in FIG. 7, the second stress-inducing layer 45 is of compressive stress. For example, the stress on the channel of the second conductivity type semiconductor device 30 that is induced by the second stress-inducing layer 45 is a compressive stress that has a magnitude ranging from 100 MPa to 4000 MPa. In another example, the compressive stress on the channel of the second conductivity type semiconductor device 30 has a magnitude ranging from 300 MPa to 1000 MPa.

Examples of stress-inducing materials suitable for the second stress-inducing layer 45, include, but are not limited to, $Si_3N_4$, SiC, silicon oxynitride, boron nitride and other like materials. The second stress-inducing layer 45 can be formed utilizing various chemical vapor deposition (CVD) processes including, for example, low pressure CVD, plasma enhanced CVD, rapid thermal CVD, BTBAS-based ($C_8H_{22}N_2Si$ reacted with ammonia) CVD, where BTBAS is a metalorganic precursor for CVD applications. The stress type may be controlled by modifying the precursor and deposition conditions.

The stress state of nitride-containing stress-inducing layers deposited by PECVD can be controlled by changing the deposition conditions to alter the reaction rate within the deposition chamber. In one embodiment, the second stress-inducing layer 45 is a comprised of a nitride, e.g., silicon nitride, in which the second stress-inducing layer 45 induces a compressive stress on at least the channel of the second conductivity type, i.e., p-type, semiconductor device 30. The stress state of a second stress-inducing layer 45 that is composed of silicon nitride may be set by changing the deposition conditions such as, $SiH_4/N_2$/He gas flow rate, pressure, RF power, and electrode gap. Although wishing not to be limited, it is believed that the incorporation of H into the nitride-containing stress-inducing layers increases the compressive nature of the layer.

The second stress-inducing layer 45 is typically a conformal layer. In one embodiment, the second stress-inducing layer 45 has a thickness ranging from 20 nm to 150 nm. In another embodiment, the second stress-inducing layer 45 has a thickness ranging from 50 nm to 100 nm. In yet a further embodiment, the second stress-inducing layer 45 has a thickness ranging from 60 nm to 80 nm.

The portion of the second stress-inducing layer 45 that is present overlying the first conductivity type semiconductor device 20 is removed using a selective etch process. This selective removal is achieved by first providing a second etch mask (not shown) atop the second portion 25 of the substrate 10 that includes the second conductivity type semiconductor device 30 and then etching the exposed second stress-inducing layer 45 that is present in the first portion 15 of the substrate 10, in which the etch for removing the exposed second stress-inducing layer 45 is selective to the underlying low-k dielectric etch stop layer 41. During the etch that removes the exposed portion of the second stress-inducing layer 45, the second etch mask protects the second conductivity type semiconductor device 30 that is present in the first portion 15 of the substrate 5. The second etch mask is then removed using a selective etch, chemical strip or oxygen ashing process to provide the structure depicted in FIG. 8. FIG. 8 depicts a structure in which a first stress-inducing layer 40 is only present over the first conductivity type semiconductor device 20, and a second stress-inducing layer 45 is present over the second conductivity type semiconductor device 30. In one embodiment, a high-k dielectric etch stop layer 35 is present between the first and second stress-inducing layers 40, 45 and the first and second conductivity type semiconductor devices 20, 30.

Figure 9:
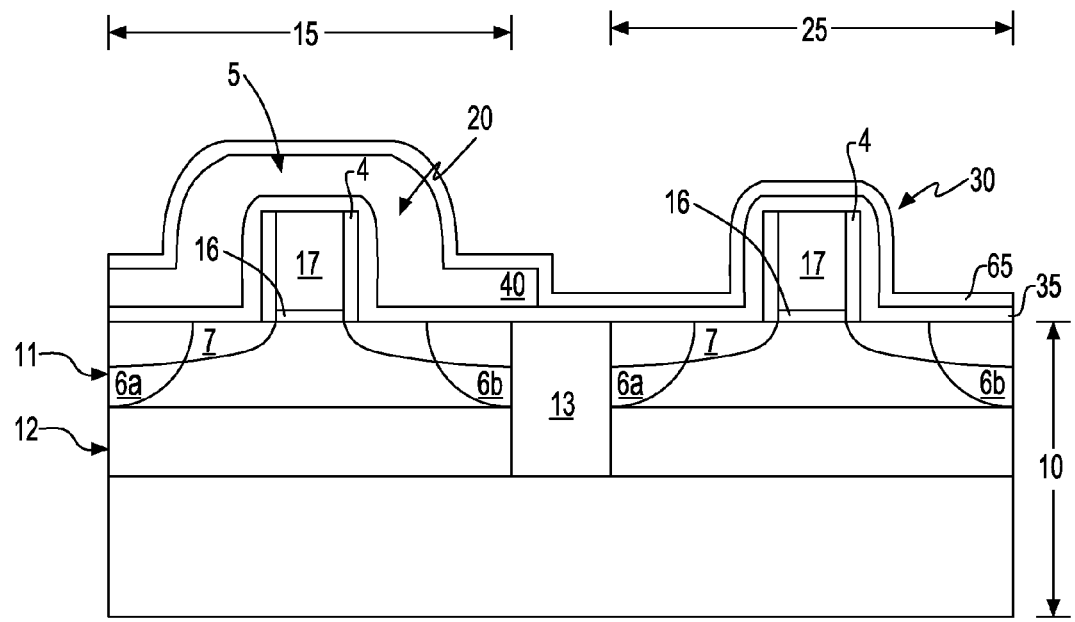
FIG. 9 is a side cross-sectional view of another embodiment of the present disclosure that utilizes at least two high-k dielectric etch stop layers, in which the first etch mask that is depicted in FIG. 6 is removed from the first portion of the substrate, and a second high-k dielectric etch stop layer is formed over the remaining portion of the first stress-inducing layer that is in the first portion of the substrate, as well as over the second conductivity type semiconductor device in the second portion of the substrate, in accordance with one embodiment of the present disclosure.

FIGS. 9-12 depict another embodiment of the present disclosure that utilizes at least two high-k dielectric etch stop layers 35, 65 to provide a structure in which a first stress-inducing layer 40 is present over only the first conductivity type semiconductor device 20 and a second stress-inducing layer 45 is present over only the second conductivity type semiconductor device 30. The initial process steps for forming the structure depicted in FIG. 9 are similar to the process sequence that is depicted in FIGS. 1-6, with the exception that the low-k dielectric etch stop layer 41 is omitted. The high-k dielectric etch stop layer 35 that is depicted in FIGS. 1-8 is referred to as the first high-k dielectric etch stop layer 35 with reference to FIGS. 9-12. FIG. 9 depicts a structure in which the first etch mask 42 that is depicted in FIG. 6 is removed from the first portion 15 of the substrate 10, and a second high-k dielectric etch stop layer 65 is formed over the remaining portion of the first stress-inducing layer 40 in the first portion 15 of the substrate 10. The second high-k dielectric layer 65 is also formed over the second conductivity type semiconductor device 30 in the second portion 25 of the substrate 10. The second high-k dielectric etch stop layer 65 may be deposited in direct contact with the first high-k dielectric etch stop layer 35 that is present on at least the sidewalls of the gate structure 5, and the upper surface of the gate structure 5, that is in the second portion 25 of the substrate 10.

The second high-k dielectric etch stop layer 65 may be composed of the same or a different material than the first high-k dielectric etch stop layer 35. The second high-k dielectric etch stop layer 65 may be composed of an oxide, a nitride, an oxynitride or combinations and multi-layers thereof. In one embodiment, the second high-k dielectric etch stop layer 65 is comprised of a material having a dielectric constant that is greater than 4.0, e.g., 4.1. In another embodiment, the second high-k dielectric etch stop layer 65 is comprised of a material having a dielectric constant greater than 7.0. In yet another embodiment, the second high-k dielectric etch stop layer 65 is comprised of a material having a dielectric constant ranging from greater than 4.0 to 30. The dielectric constants mentioned herein are relative to a vacuum at room temperature, i.e., 20° C. to 25° C.

Some examples of high-k dielectric materials suitable for the second high-k dielectric etch stop layer 65 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

In one embodiment, the second high-k dielectric etch stop layer 65 is a conformal layer that is formed using a conformal deposition process. In one embodiment, the second high-k dielectric etch stop layer 65 is formed using a deposition process, such as chemical vapor deposition (CVD). Variations of chemical vapor deposition (CVD) processes for depositing the second high-k dielectric etch stop layer 65 include, but are not limited to, Atomic Layer CVD (ALCVD), Atmospheric Pressure CVD (APCVD), Low Pressure CVD (LPCVD) and Plasma Enhanced CVD (PECVD), Metal-Organic CVD (MOCVD) and others. One example of a conformal deposition process is plasma enhanced chemical vapor deposition (PECVD). In another embodiment, the second high-k dielectric etch stop layer 65 may be formed by a thermal growth process such as, for example, oxidation, nitridation or oxynitridation. In one embodiment, the second high-k dielectric etch stop layer 65 has a thickness that is less than 20 Å. In another embodiment, the second high-k dielectric etch stop layer 65 has a thickness that ranges from 15 Å to 20 Å. In one example, the second high-k dielectric etch stop layer 65 is hafnium oxide ($HfO_2$).

Figure 10:
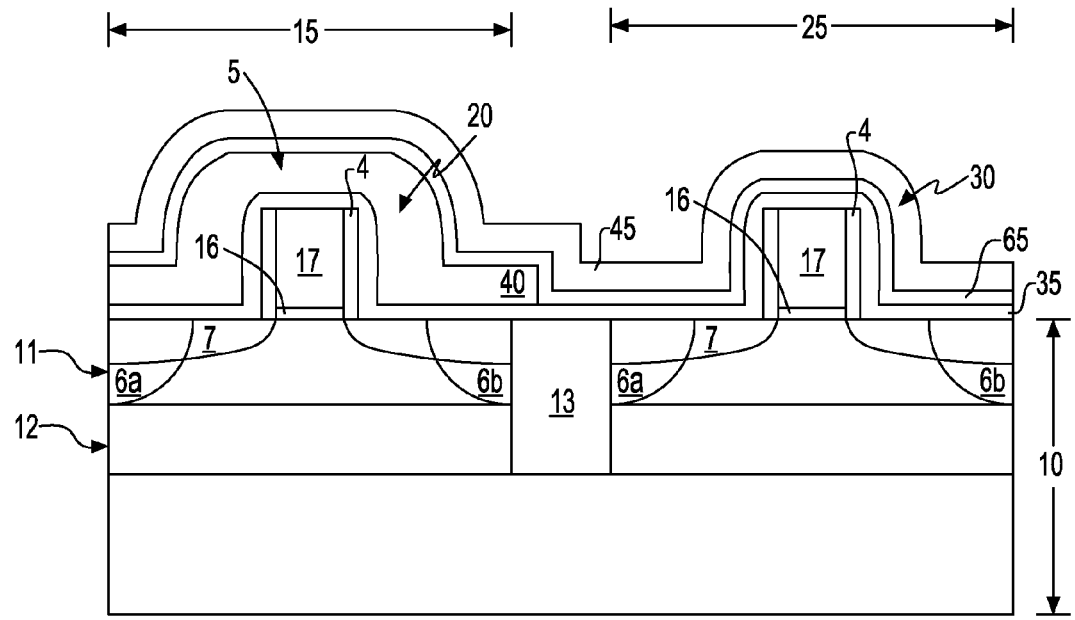
FIG. 10 is a side cross-sectional view of forming a second stress-inducing layer on the second high-k dielectric etch stop layer that is present on the remaining portion of the first stress-inducing layer and on the second high-k dielectric etch stop layer that is present on the first high-k dielectric etch stop layer, in accordance with one embodiment of the present disclosure.

FIG. 10 depicts one embodiment of forming a second stress-inducing layer 45 on the second high-k dielectric etch stop layer 65 that is present on the remaining portion of the first stress-inducing layer 40, and on the second high-k dielectric etch stop layer 65 that is present on the first high-k dielectric etch stop layer 35 that is over the second conductivity type semiconductor device 30. The second stress-inducing layer 45 that is depicted in FIG. 10 is similar to the second stress-inducing layer 45 that is described above with reference to FIG. 7. Therefore, the above description of the second stress-inducing layer 45 that is in reference to FIG. 7, is applicable to the second stress-inducing layer 45 that is illustrated in FIG. 10.

Figure 11:
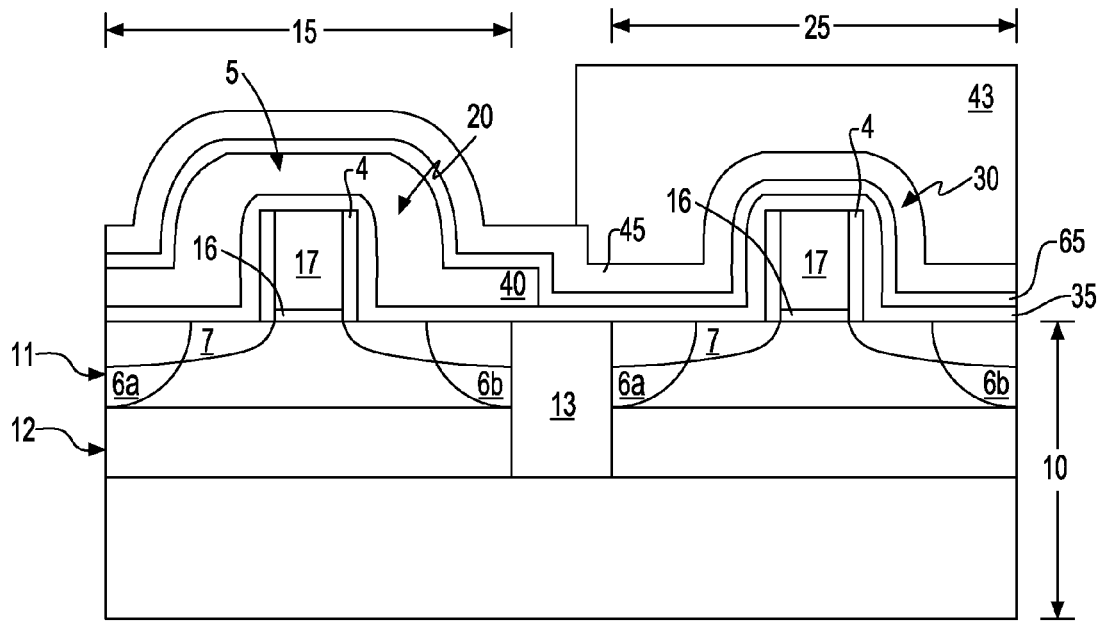
FIG. 11 is a side cross-sectional view of forming a second etch mask over the second stress-inducing layer that is present in a second portion of the substrate, in accordance with one embodiment of the present disclosure.

FIG. 11 depicts one embodiment of forming a second etch mask 43 over the second stress-inducing layer 45 that is present in a second portion 25 of the substrate 10. The second etch mask 43 that is depicted in FIG. 11 may comprise soft and/or hardmask materials and can be formed using deposition, photolithography and etching. The second etch mask 43 that is depicted in FIG. 11 is similar to the first etch mask 42 that is depicted in FIG. 5. The description of the first etch mask 42 is applicable for the second etch mask 43 that is formed over the second portion 25 of the substrate 5, as depicted in FIG. 11.

Figure 12:
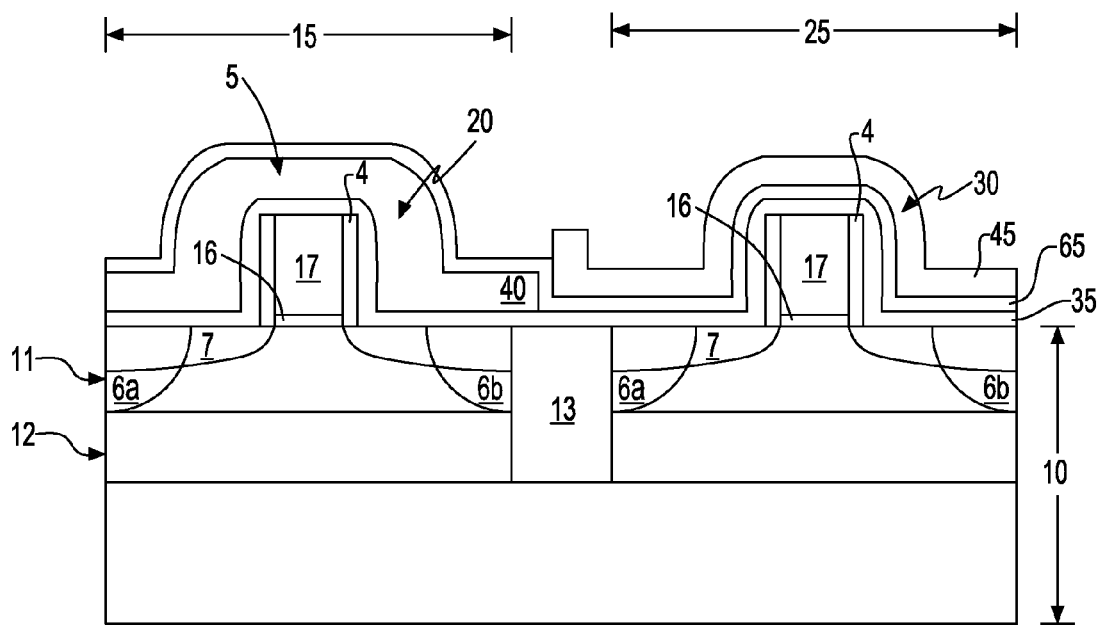
FIG. 12 is a side cross-sectional view of removing the exposed portion of the second stress-inducing layer with an etch that is selective to the second high-k dielectric etch stop layer and the second etch mask, and removing the second etch mask, in accordance with one embodiment of the present disclosure.

FIG. 12 depicts one embodiment of removing the exposed portion of the second stress-inducing layer 45 that is present over the first conductivity type semiconductor device 20 with an etch that is selective to the second high-k dielectric etch stop layer 65. The etch process for removing the exposed portion of the second high-k stress-inducing layer 65, may be an anisotropic etch process or an isotropic etch process. The anisotropic etch for removing the exposed portion of the second stress-inducing layer 45 may include reactive-ion etching (RIE).

In one embodiment, when the second stress-inducing layer 45 is composed of silicon nitride ($Si_3N_4$), the second high-k dielectric etch stop layer 65 is composed of hafnium oxide ($HfO_2$), and the second etch mask 43 is composed of a photoresist material, the etch chemistry for removing the exposed portion of the second stress-inducing layer 45 selective to the second high-k dielectric etch stop layer 65 and the second etch mask 45 may be composed of at least one of hydrofluoric acid (HF), buffered HF, and phosphoric acid ($H_3PO_4$) solutions. Following removal of the exposed portions of the second stress-inducing layer 45, the second etch mask 43 may be removed. The second etch mask 43 may be removed using a selective etch process, a chemical strip or oxygen ashing.

The use of high-k dielectric materials provides a reduced thickness in the etch stop layer when compared to etch stop layers that are composed of low-k dielectric materials. For example, a high-k dielectric etch stop layer that is composed of hafnium oxide ($HfO_2$) has a thickness of less than 20 Å, whereas a low-k dielectric etch stop layer that is composed of silicon oxide ($SiO_2$) has a thickness that is greater than 25 Å. By decreasing the thickness of the etch stop layer, the thickness of the stress-inducing layers may be increased, which in turn increases the performance enhancement that is provided by the stress-induced increases in carrier mobility. For example, the use of a high-k dielectric etch stop layer having a thickness ranging from 15 Å to 20 Å, and being composed of hafnium oxide ($HfO_2$), provides a 0.25% to 2.0% increase in the drive current (Ieff) of the transistor due to higher stress coupling to the transistor in comparison to the similar structures employing a low-k dielectric etch stop layer that is composed of silicon oxide ($SiO_2$) and has a thickness ranging from 30 Å to 50 Å. In another example, the use of a high-k dielectric etch stop layer having a thickness ranging from 15 Å to 20 Å, and being composed of hafnium oxide ($HfO_2$), provides a 0.5% to 1.0% increase in the Ieff in comparison to the similar structures employing a low-k dielectric etch stop layer that is composed of silicon oxide ($SiO_2$) and has a thickness ranging from 30 Å to 50 Å.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A method of forming a semiconductor device comprising:

forming a first high-k dielectric etch stop layer over at least a first conductivity type semiconductor device on a first portion of a substrate and at least a second conductivity type semiconductor device on a second portion of the semiconductor device;

forming a first stress-inducing layer over the first conductivity type semiconductor device and the second conductivity type semiconductor device;

removing a portion of the first stress-inducing layer that is over the second conductivity type semiconductor device with an etch that is selective to the first high-k dielectric etch stop layer to provide an exposed surface of second portion of the substrate that includes at least the second conductivity type semiconductor device;

depositing a second high-k dielectric etch stop layer over a remaining portion of the first stress-inducing layer;

forming a second stress-inducing layer over the second conductivity type semiconductor device; and removing a portion of the second stress-inducing layer that is overlying the remaining portion of the first stress-inducing layer with an etch that is selective to the second high-k dielectric etch stop layer.

2. The method of claim 1, wherein the first conductivity type semiconductor device is an n-type semiconductor device and the second conductivity type semiconductor device is a p-type semiconductor device.

3. The method of claim 1, wherein the first conductivity type semiconductor device includes a first gate structure and the second conductivity type semiconductor device includes a second gate structure, and wherein prior to forming first the high-k dielectric etch stop layer, spacers are removed from sidewalls of the first gate structure and the second gate structure.

4. The method of claim 3, wherein the forming of said first high-k dielectric etch stop layer comprises depositing the first high-k dielectric etch stop layer on the sidewalls of the first gate structure and the second gate structure, an upper surface of the first gate structure and the second gate structure, and a portion of an upper surface of the substrate separating the first gate structure and the second gate structure.

5. The method of claim 4, wherein the first high-k dielectric etch stop layer is a Hf-containing material, and the first high-k dielectric etch stop layer has a thickness of 20 Å or less.

6. The method of claim 2, wherein the forming of the first stress-inducing layer over the first conductivity type semiconductor device and the second conductivity type semiconductor device comprises depositing a tensile stress-inducing dielectric layer.

7. The method of claim 2, wherein the removing of the portion of the first stress-inducing layer that is over the second conductivity type semiconductor device comprises: forming an etch mask over the first stress-inducing layer that is overlying the first conductivity type semiconductor device; and etching an exposed portion of the first stress-inducing layer that is over the second conductivity type semiconductor device with the etch that is selective to the high-k dielectric etch stop layer, wherein the etch is also selective to the etch mask.

8. The method of claim 2, wherein the forming of the second stress-inducing layer over the second conductivity type semiconductor device comprises depositing a compressive stress-inducing dielectric layer.

9. A method of forming a semiconductor device comprising:

forming a first high-k dielectric etch stop layer over at least a first conductivity type semiconductor device on a first portion of a substrate and at least a second conductivity type semiconductor device on a second portion of the semiconductor device, wherein the first conductivity type semiconductor device is an n-type semiconductor device and the second conductivity type semiconductor device is a p-type semiconductor device, and the first conductivity type semiconductor device includes a first gate structure and the second conductivity type semiconductor device includes a second gate structure, and wherein prior to forming the first high-k dielectric etch stop layer, spacers are removed from sidewalls of the first gate structure and the second gate structure;

forming a first stress-inducing layer over the first portion and the second portion of the substrate;

removing a portion of the first stress-inducing layer that is formed over the second portion of the substrate with an etch that is selective to the first high-k dielectric etch stop layer to expose at least the second conductivity type semiconductor device;

forming a second high-k dielectric etch stop layer over a remaining portion of the first stress-inducing layer;

forming a second stress-inducing layer over the second conductivity type semiconductor device; and removing a portion of the second stress-inducing layer that is overlying the remaining portion of the first stress-inducing layer with an etch that is selective to the second high-k dielectric etch stop layer.

10. The method of claim 9, wherein the forming of the first high-k dielectric etch stop layer comprises depositing the first high-k dielectric etch stop layer on the sidewalls of the first gate structure and the second gate structure, an upper surface of the first and second gate structures, and a portion of an upper surface of the substrate separating the first gate structure from the second gate structure.

11. The method of claim 9, wherein the forming of first stress-inducing layer over the first conductivity type semiconductor device and the second conductivity type semiconductor device comprises depositing a tensile stress-inducing dielectric layer.

12. The method of claim 9, wherein the removing of the portion of the first stress-inducing layer that is over the second conductivity type semiconductor device comprises:

forming a first etch mask over the first stress-inducing layer that is overlying the first conductivity type semiconductor device; and etching an exposed portion of the first stress-inducing layer that is over the second conductivity type semiconductor device with the etch that is selective to the first high-k dielectric etch stop layer, wherein the etch is also selective to the first etch mask.

13. The method of claim 9, wherein the forming a second high-k dielectric etch stop layer over the remaining portion of the first stress-inducing layer comprises removing the first etch mask and depositing the second high-k dielectric etch stop layer over the remaining portion of the first stress-inducing layer and on an exposed portion of the first high-k dielectric etch stop layer that is present in the second portion of the substrate.

14. The method of claim 9, wherein the forming of the second stress-inducing layer over the second conductivity type semiconductor device comprises depositing a compressive stress-inducing dielectric layer on the second high-k dielectric etch stop layer that is present on the remaining portion of the first stress-inducing layer and on the second high-k dielectric etch stop layer that is present on the first high-k dielectric etch stop layer.

15. The method of claim 14, wherein the removing of the portion of the second stress-inducing layer that is overlying the remaining portion of the first stress-inducing layer with the etch that is selective to the second high-k dielectric etch stop layer comprises: forming a second etch mask over a portion of the second stress-inducing layer that is in the second portion of the substrate;

etching the portion of the second stress-inducing layer that is overlying the remaining portion of the first stress-inducing layer, wherein the etch that removes the portion of the second stress-inducing layer that is overlying the remaining portion of the first stress-inducing layer is also selective to the second etch mask; and removing the second etch mask, wherein a remaining portion of the first stress-inducing layer is in the second portion of the substrate.

16. A method of forming a semiconductor device comprising:

forming a high-k dielectric etch stop layer over at least a first conductivity type semiconductor device on a first portion of a substrate and at least a second conductivity type semiconductor device on a second portion of the semiconductor device, wherein the first conductivity type semiconductor device includes a first gate structure and the second conductivity type semiconductor device includes a second gate structure, and wherein prior to forming the high-k dielectric etch stop layer, spacers are removed from sidewalls of the first gate structure and the second gate structure;

forming a first stress-inducing layer over the first conductivity type semiconductor device and the second conductivity type semiconductor device;

removing a portion of the first stress-inducing layer that is over the second conductivity type semiconductor device with an etch that is selective to the high-k dielectric etch stop layer to provide an exposed surface of second portion of the substrate that includes at least the second conductivity type semiconductor device; and forming a second stress-inducing layer over the second conductivity type semiconductor device.

17. The method of claim 16, wherein the forming of the high-k dielectric etch stop layer comprises depositing the high-k dielectric etch stop layer on the sidewalls of the first gate structure and the second gate structure, an upper surface of the first gate structure and the second gate structure, and a portion of an upper surface of the substrate separating the first gate structure and the second gate structure.

18. The method of claim 16, wherein the high-k dielectric etch stop layer is a Hf-containing material, and the high-k dielectric etch stop layer has a thickness of 20 Å or less.

* * * * *